US012342625B2

(12) United States Patent
Wan et al.

(10) Patent No.: US 12,342,625 B2
(45) Date of Patent: Jun. 24, 2025

(54) ARRAY SUBSTRATE AND DISPLAY DEVICE

(71) Applicants: Chongqing BOE Optoelectronics Technology Co., Ltd., Chongqing (CN); BOE Technology Group Co., Ltd., Beijing (CN)

(72) Inventors: Bin Wan, Beijing (CN); Xiaoyuan Wang, Beijing (CN); Junming Chen, Beijing (CN); Guodong Yang, Beijing (CN); Xun Pu, Beijing (CN); Yuanyuan Zhu, Beijing (CN); Zhicheng Fan, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/704,903

(22) PCT Filed: Apr. 28, 2023

(86) PCT No.: PCT/CN2023/091446
§ 371 (c)(1),
(2) Date: Apr. 25, 2024

(87) PCT Pub. No.: WO2023/226687
PCT Pub. Date: Nov. 30, 2023

(65) Prior Publication Data
US 2025/0081613 A1    Mar. 6, 2025

(30) Foreign Application Priority Data

May 25, 2022   (CN) .......................... 202210580442.2

(51) Int. Cl.
*H10D 86/60*   (2025.01)
*G02F 1/1362*  (2006.01)
(Continued)

(52) U.S. Cl.
CPC ....... *H10D 86/60* (2025.01); *G02F 1/136222* (2021.01); *G02F 1/136286* (2013.01); *G02F 1/1368* (2013.01); *H10D 86/443* (2025.01)

(58) Field of Classification Search
CPC .............. H10D 86/60; G02F 1/136222; G02F 1/136286; G02F 1/1368
See application file for complete search history.

(56) References Cited

U.S. PATENT DOCUMENTS

| 2018/0095334 A1 | 4/2018 | Zang et al. |
| 2019/0196638 A1 | 6/2019 | Tominaga et al. |

(Continued)

FOREIGN PATENT DOCUMENTS

| CN | 101075054 A | 11/2007 |
| CN | 104699316 A | 6/2015 |

(Continued)

OTHER PUBLICATIONS

CN202210580442.2 Notification to grant patent right for invention dated Jul. 19, 2023.

*Primary Examiner* — Joseph L Williams
(74) *Attorney, Agent, or Firm* — IPro, PLLC (57) ABSTRACT

Provided is an array substrate, having a plurality of sub-pixel regions. The array substrate includes: a substrate; a pixel electrode layer and a common electrode layer that are disposed on the substrate; and a plurality of common signal lines disposed on the substrate. The plurality of common signal lines are insulated from the pixel electrode layer and electrically connected to the common electrode layer. An overlapped region is present between an orthographic projection of the common signal lines on the substrate and an orthographic projection of the pixel electrode layer on the substrate. The common signal lines have a plurality of electrode structures, wherein different electrode structures of the plurality of electrodes structures are disposed in different (Continued)

sub-pixel regions, and the plurality of electrode structures include a lap electrode lapped to the common electrode layer and an auxiliary electrode not lapped to the common electrode layer.

20 Claims, 8 Drawing Sheets

(51) Int. Cl.
*G02F 1/1368* (2006.01)
*H10D 86/40* (2025.01)

(56) References Cited

U.S. PATENT DOCUMENTS

| | | |
|---|---|---|
| 2019/0219853 A1 | 7/2019 | Liao et al. |
| 2021/0320156 A1 | 10/2021 | Shang et al. |
| 2024/0355840 A1* | 10/2024 | Shu .................. H10D 30/67 |
| 2025/0044653 A1* | 2/2025 | Tong ................. H10D 86/441 |

FOREIGN PATENT DOCUMENTS

| | | |
|---|---|---|
| CN | 108803173 A | 11/2018 |
| CN | 109212845 A | 1/2019 |
| CN | 111965908 A | 11/2020 |
| CN | 112689791 A | 4/2021 |
| CN | 112782896 A | 5/2021 |
| CN | 113867056 A | 12/2021 |
| CN | 114994989 A | 9/2022 |
| KR | 20160137770 A | 12/2016 |

\* cited by examiner

ARRAY SUBSTRATE AND DISPLAY DEVICE

CROSS-REFERENCE TO RELATED APPLICATION

This application is a U.S. national stage of international application No. PCT/CN2023/091446, field on Apr. 28, 2023, which claims priority to Chinese Patent Application No. 202210580442.2, filed on May 25, 2022, and entitled "ARRAY SUBSTRATE AND DISPLAY APPARATUS," the contents of which are herein incorporated by reference in their entireties.

TECHNICAL FIELD

The present disclosure relates to the field of display technologies, and in particular, relates to an array substrate and a display device.

BACKGROUND

Nowadays, display devices have become indispensable electronic products in daily life. Display devices such as smart bracelets, mobile phones, and tablet computers have greatly increased the convenience of people's lives.

SUMMARY

Embodiments of the present disclosure provide an array substrate and a display device. The technical solutions are as follows.

According to some embodiments of the present disclosure, an array substrate is provided. The array substrate has a plurality of sub-pixel regions. The array substrate includes:
a substrate;
  a pixel electrode layer and a common electrode layer that are disposed on the substrate; and
  a plurality of common signal lines disposed on the substrate, wherein the plurality of common signal lines are insulated from the pixel electrode layer and electrically connected to the common electrode layer, and an overlapped region exits between an orthographic projection of the common signal lines on the substrate and an orthographic projection of the pixel electrode layer on the substrate;
  wherein the common signal lines have a plurality of electrode structures, wherein different electrode structures of the plurality of electrodes structures are disposed in different sub-pixel regions, and the plurality of electrode structures include a lap electrode lapped to the common electrode layer and an auxiliary electrode not lapped to the common electrode layer.

In some embodiments, an orthographic projection of the auxiliary electrode on the substrate and an orthographic projection of the lap electrode on the substrate have a same shape and a same area.

In some embodiments, the plurality of sub-pixel regions include sub-pixel regions of at least two colors, wherein the plurality of electrode structures are in one-to-one correspondence with a plurality of the sub-pixel regions within sub-pixel regions of a same color, and each of the electrode structures is disposed in a corresponding one of the sub-pixel regions.

In some embodiments, for any adjacent two sub-pixel regions of the sub-pixel regions of the same color, one of the two pixel regions has the lap electrode distributed therein, and the other of the two pixel regions has the auxiliary electrode distributed therein.

In some embodiments, the sub-pixel region in which the electrode structure is distributed is a blue sub-pixel region.

In some embodiments, the array substrate has a plurality of vias, wherein the common electrode layer is lapped to the lap electrode by at least one of the vias, and an orthographic projection of each of the vias on the substrate is at least partially overlapped with an orthographic projection of the lap electrode on the substrate.

In some embodiments, one portion of the orthographic projection of the via on the substrate is within the orthographic projection of the lap electrode on the substrate, and the other portion of the orthographic projection of the via on the substrate is outside the orthographic projection of the lap electrode on the substrate.

In some embodiments, the pixel electrode layer is closer to the substrate with respect to the common electrode layer, and the pixel electrode layer includes a pixel electrode disposed within the sub-pixel region, wherein an orthographic projection of the pixel electrode on the substrate is not overlapped with an orthographic projection of the electrode structure on the substrate.

In some embodiments, a hollowed-out structure is formed in the pixel electrode, wherein within a same one of the sub-pixel regions, the orthographic projection of the electrode structure on the substrate is within an orthographic projection of the hollowed-out structure on the substrate.

In some embodiments, within the respective sub-pixel regions, outer boundaries of the orthographic projections of the electrode structures on the substrate are spaced equally from outer boundaries of the orthographic projections of the hollowed-out structures on the substrate.

In some embodiments, the array substrate further includes: a plurality of data lines, a plurality of gate lines, and a plurality of transistors, the plurality of transistors being in one-to-one correspondence with a plurality of the pixel electrodes; wherein
  one of the gate lines is electrically connected to a gate electrode of each of the transistors in a same row of the transistors, wherein the gate line and the common signal lines are disposed in a same layer and made of a same material, and an extension direction of the gate line is parallel to an extension direction of each of the common signal lines; and
  one of the data lines is electrically connected to a first electrode of each of the transistors in a same column of the transistors, and a second electrode of each of the transistors is electrically connected to a corresponding one of the pixel electrodes.

In some embodiments, for any adjacent two transistors in a column of the transistors that are electrically connected to a same one of the data lines, one of the two transistors is disposed on one side of the data line, and the other of the two transistors is disposed on the other side of the data line.

In some embodiments, the array substrate further includes: a first insulating layer disposed on a side, away from the substrate, of the plurality of transistors, and a second insulating layer disposed between the pixel electrode layer and the common electrode layer;
  wherein the pixel electrode layer is disposed on a side, away from the substrate, of the first insulating layer.

In some embodiments, the common electrode layer has a plurality of slits.

According to some embodiments of the present disclosure, a display device is provided. The display device includes a color film substrate, a liquid crystal layer, and the array substrate as described above; wherein the array substrate and the color film substrate are disposed opposite to each other, and the liquid crystal layer is disposed between the array substrate and the color film substrate.

BRIEF DESCRIPTION OF DRAWINGS

For clearer descriptions of the technical solutions in the embodiments of the present disclosure, the following briefly introduces the accompanying drawings to be required in the descriptions of the embodiments. Apparently, the accompanying drawings in the following description show merely some embodiments of the present disclosure, and persons of ordinary skills in the art may still derive other drawings from these accompanying drawings without creative efforts.

DETAILED DESCRIPTION

The present disclosure is described in further detail with reference to the accompanying drawings, to clearly present the objects, technical solutions, and advantages of the present disclosure.

The display device includes an array substrate and a color film substrate that are disposed opposite each other, and a liquid crystal layer disposed in the array substrate and the color film substrate. The array substrate includes a substrate, and a common signal line and a common electrode that are disposed on the substrate. The common signal line and the common electrode are disposed in different layers, and the common signal line and the common electrode are electrically connected to each other through a via. However, the display effect of the current display device is poor.

Figure 1:
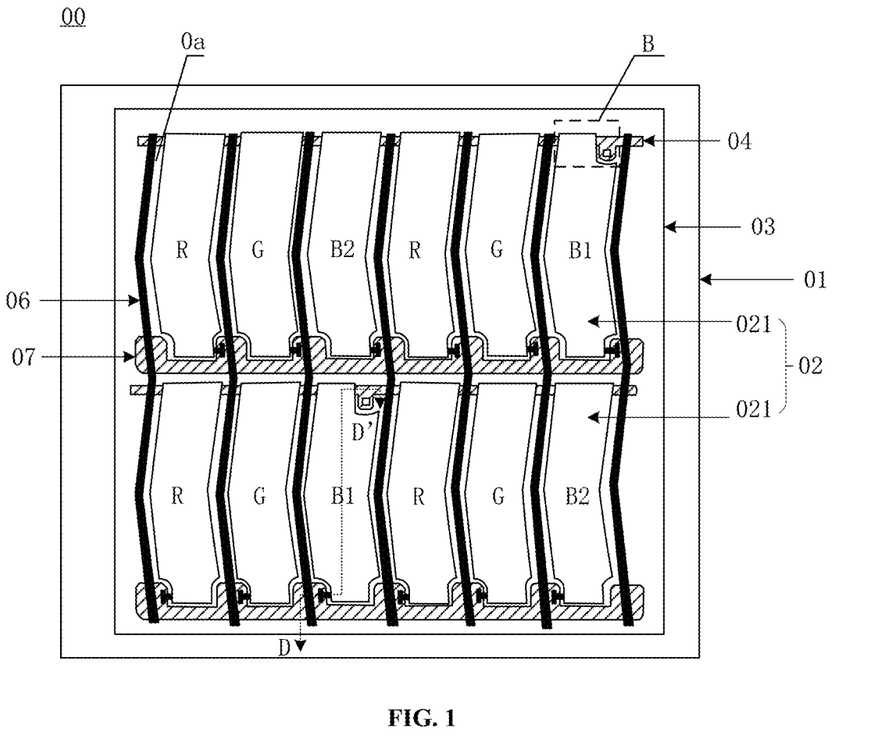
FIG. 1 is a top view of a common array substrate.
Figure 2:
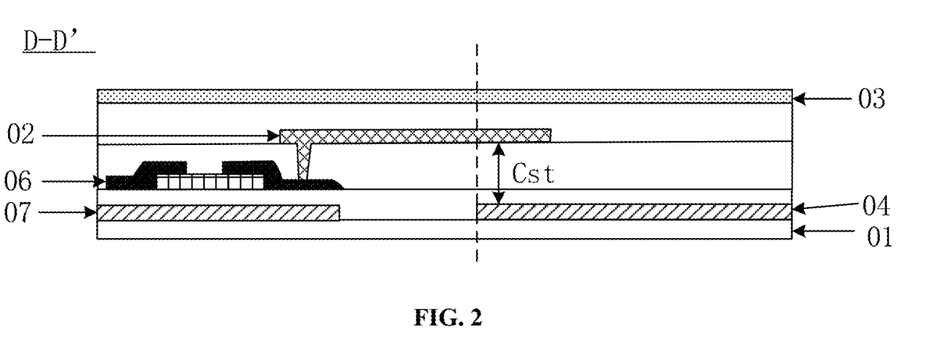
FIG. 2 is a cross-sectional view of the array substrate illustrated in FIG. 1 along a line D-D'.

FIG. 1 is a top view of a common array substrate. FIG. 2 is a cross-sectional view of the array substrate illustrated in FIG. 1 along a line D-D'. Referring to FIGS. 1 and 2, the array substrate 00 includes a substrate 01, a pixel electrode layer 02 and a common electrode layer 03 that are disposed on the substrate 01, and a plurality of common signal lines 04 disposed on the substrate 01. The plurality of common signal lines 04 are insulated from the pixel electrode layer 02 and electrically connected to the common electrode layer 03.

The array substrate 00 has a plurality of sub-pixel regions 0a. For example, the array substrate 00 further includes a plurality of data lines 06 and a plurality of gate lines 07. Any two adjacent data lines 06 and any two adjacent gate lines 07 are capable of enclosing and forming one of the sub-pixel regions 0a. The pixel electrode layer 02 includes pixel electrodes 021 distributed within each sub-pixel region 0a.

An orthographic projection of the common electrode line 04 on the substrate 01 is at least partially overlapped with an orthographic projection of the pixel electrode 021 on the substrate 01, such that a portion where the common electrode line 04 is overlapped with the pixel electrode 021 is capable of forming a storage capacitance Cst. The storage capacitance Cst is capable of maintaining a pixel voltage loaded on the pixel electrode 021, such that a display device integrated with this array substrate 00 is capable of continuously displaying images.

As shown in FIG. 1, the plurality of sub-pixel regions 0a in the array substrate 00 include: a plurality of red sub-pixel regions R, a plurality of green sub-pixel regions G, and a plurality of blue sub-pixel regions (B1, B2).

Figure 3:
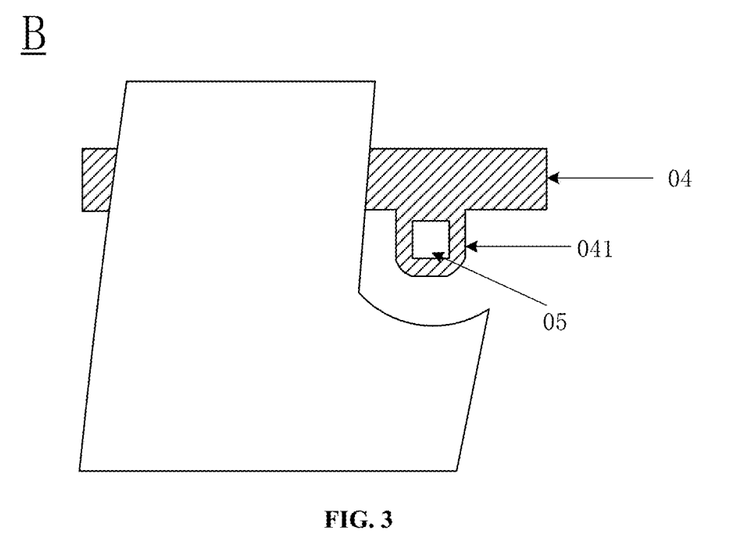
FIG. 3 is a partially enlarged view of the array substrate illustrated in FIG. 1 at a position B.

For a clearer understanding of the structure of the array substrate, please refer to FIG. 3, which is a partially enlarged view of the array substrate illustrated in FIG. 1 at a position B. The array substrate 00 has a plurality of vias 05. The common signal line 04 has a lap electrode 041 corresponding to the via 05. The common electrode layer 03 is lapped to the lap electrodes 041 of the common signal lines 04 by the plurality of vias 05, such that the common electrode layer 03 is electrically connected to the common signal lines 04. It should be noted that in a case where the number of vias 05 within the array substrate 00 is large, it will lead to uneven diffusion of the alignment fluid used to form the alignment film during the process of forming the alignment film on the array substrate 00. Consequently, the display device is highly prone to the undesirable problem of uneven brightness after this array substrate 00 is subsequently integrated within the display device, which affects the display effect of the display device. Therefore, there is a need to reduce the number of vias 05 within the array substrate 00. For example, one via 05 is formed for every six sub-pixel regions in the array substrate 00.

In this case, one via 05 is formed in each of the blue sub-pixel regions B1, while no via 05 is formed in the blue sub-pixel region B2 adjacent to the blue sub-pixel region B1. Moreover, the lap electrodes 041 are distributed in each of the blue sub-pixel regions B1, while no lap electrode 041 is distributed in each of the blue sub-pixel regions B2. Whether or not the lap electrodes 041 are distributed in a sub-pixel region directly affects the size of the storage capacitance formed between the pixel electrode 021 and the common electrode line 04 in this sub-pixel region. Therefore, a size of a storage capacitance formed between the pixel electrode 021 and the common electrode line 04 within the blue sub-pixel region B1 is different from a size of a storage capacitance formed between the pixel electrode 021 and the common electrode line 04 within the blue sub-pixel region B2.

An actual potential loaded on the pixel electrode 021 within each sub-pixel region 0a within the array substrate 00 is related to the magnitude of the storage capacitance within this sub-pixel region 0a. For example, a difference $\Delta$Vp between a preset potential and an actual potential loaded on the pixel electrodes 021 is calculated by the following equation:

$$\Delta Vp = Cgs/(Cgs + Clc + Cst) * (Vgh - Vgl).$$

Cgs represents a coupling capacitance formed between the gate line 07 and the data line 06 within the sub-pixel region 0a; Clc represents a liquid crystal capacitance formed between the pixel electrode 021 and the common electrode layer 03 within the sub-pixel region 0a; Cst represents a storage capacitance formed by an overlap portion of the common electrode line 04 and the pixel electrode 021; Vgh represents a high-level voltage loaded on the gate line 07 voltage; and Vgl represents a low-level voltage loaded on the gate line 07.

Accordingly, in the case where the size of the storage capacitance within the blue sub-pixel region B1 is different from the size of the storage capacitance within the blue sub-pixel region B2, a value of $\Delta$Vp corresponding to the pixel electrode 021 within the blue sub-pixel region B1 is different from a value of $\Delta$Vp corresponding to the pixel electrode 021 within the blue sub-pixel region B2. Therefore, even if the array substrate 00 applies signals with the same potential to the pixel electrodes 021 within the two blue sub-pixel regions simultaneously (i.e., both are loaded with the preset potential), the actual potential loaded on the pixel electrode 021 within the blue sub-pixel region B1 is different from the actual potential loaded on the pixel electrode 021 within the blue sub-pixel region B2. In this case, in a case where a display device integrated with this array substrate 00 displays a blue image in a column inversion manner, the blue image displayed by the display device is highly susceptible to undesirable phenomena such as screen flickering and jittering.

Figure 4:
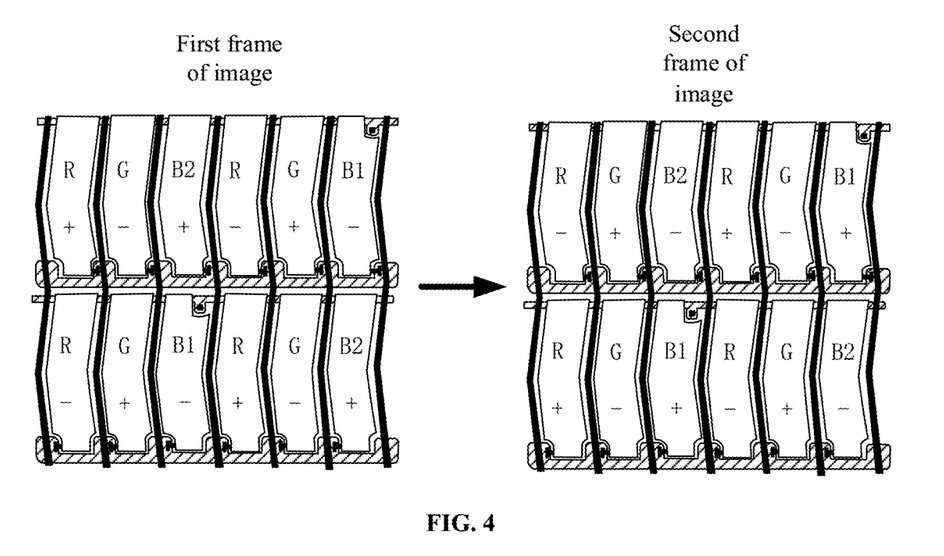
FIG. 4 is a schematic diagram of polarity changes of voltages corresponding to each sub-pixel region in a case where the display device is displayed in a column inversion manner.

Referring to FIG. 4, which is a schematic diagram of polarity changes of voltages corresponding to each sub-pixel region in a case where the display device is displayed in a column inversion manner. In FIG. 4, a first frame screen represents the polarities of pixel voltages loaded by the pixel electrodes 021 within the respective sub-pixel regions 0a before the column inversion, and a second frame screen represents the polarities of pixel voltages loaded by the pixel electrodes 021 within the respective sub-pixel regions 0a after the column inversion. The polarities of the pixel voltages loaded by the pixel electrodes 021 within the respective sub-pixel regions 0a before and after the column inversion are reversed.

In this way, to ensure that the display device does not suffer from undesirable phenomena such as flickering and jittering when displaying images, it is necessary to ensure that the brightness of the respective sub-pixel regions 0a before column inversion and after column inversion is similar or same. In the case where the display device displays images, the brightness of the sub-pixel region 0a is related to a voltage difference formed between the pixel electrode 021 and the common electrode layer 03 within this sub-pixel region 0a. Therefore, in the case where the voltage differences formed between the pixel electrode 021 and the common electrode layer 03 within the sub-pixel region 0a before and after column inversion are ensured to be the same, the extent of the undesirable phenomena such as flickering and jittering of the display device when displaying the images is reduced.

However, the value of $\Delta$Vp corresponding to the pixel electrode 021 in the blue sub-pixel region B1 is not the same as the value of $\Delta$Vp corresponding to the pixel electrode 021 in the blue sub-pixel region B2, and the pixel electrodes in respective sub-pixel regions 0a share a common electrode layer 03. Therefore, in a case where the display device uses the value of $\Delta$Vp corresponding to the pixel electrode 021 of one of the blue sub-pixel regions B1 and B2 (the following embodiment uses B1 as an example) as the basis for designing a common voltage Vcom loaded by the common electrode layer 03, it is possible to ensure that the voltage differences formed between the pixel electrode 021 within the sub-pixel region B1 and the common electrode layer 03 are the same before and after the column inversion. However, because the actual potential loaded on the pixel electrode 021 within the blue sub-pixel region B1 is different from the actual potential loaded by the pixel electrode 021 within the blue sub-pixel region B2, the voltage difference formed between the pixel electrode 021 within the sub-pixel region B2 and the common electrode layer 03 before and after the column inversion are different. Therefore, in a case where the display device displays blue images, the blue images displayed by this display device are highly susceptible to undesirable phenomena such as flickering and jittering. In particular, in a case where the display device displays blue monochrome images of a low grey scale, the undesirable phenomena such as flickering and dithering of sub-pixels corresponding to the blue sub-pixel region are most obvious. Thus, the display effect of the current display device is poor.

Figure 5:
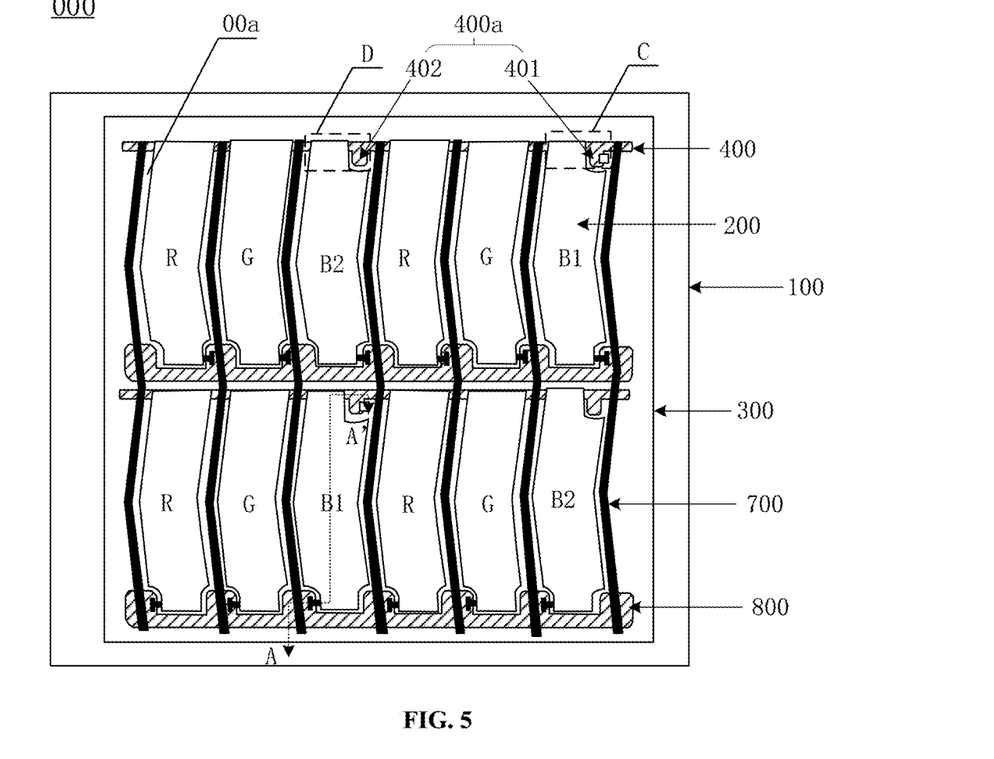
FIG. 5 is a top view of an array substrate according to some embodiments of the present disclosure.
Figure 6:
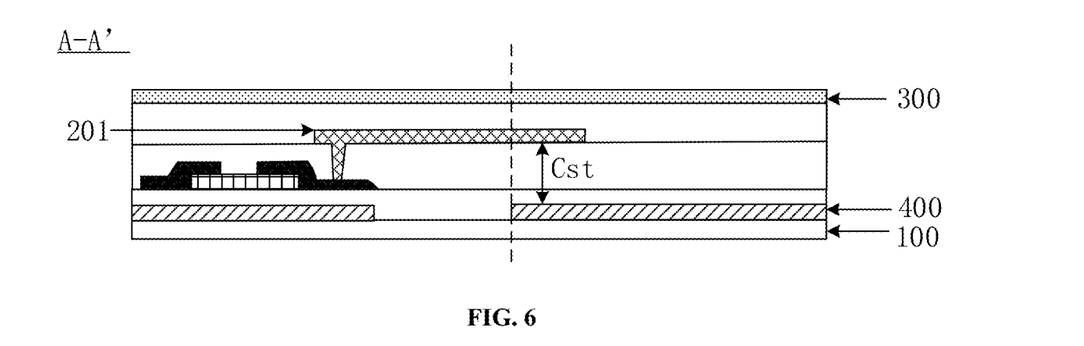
FIG. 6 is a cross-sectional view of the array substrate illustrated in FIG. 5 along a line A-A'.

FIG. 5 is a top view of an array substrate according to some embodiments of the present disclosure. FIG. 6 is a cross-sectional view of the array substrate illustrated in FIG. 5 along a line A-A'. Referring to FIG. 5 and FIG. 6, the array substrate 000 has a plurality of sub-pixel regions 00a. The array substrate 000 includes a substrate 100, and a pixel electrode layer 200, a common electrode layer 300, and a plurality of common signal lines 400 that are disposed on the substrate 100.

Exemplarily, the array substrate 000 further includes a plurality of data lines 700 and a plurality of gate lines 800 that are disposed on the substrate 100. The plurality of data lines 700 are disposed in parallel. An extension direction of the data line 700 is intersected with an extension direction of the gate line 800. In the array substrate 000, any adjacent two data lines 700 and any adjacent two gate lines 800 enclose and form a sub-pixel region 00a.

The common signal line 400 in the array substrate 000 is insulated from the pixel electrode layer 200 and electrically connected to the common electrode layer 300.

An overlapped region is present between an orthographic projection of the common signal line 400 on the array substrate 000 and an orthographic projection of the pixel electrode layer 200 on the substrate 100. The pixel electrode layer 200 in the array substrate 000 includes pixel electrodes 201 distributed within the sub-pixel regions 00a. As shown in FIG. 6, an overlapped region is present between an orthographic projection of the pixel electrode 201 within each sub-pixel region 00a on the substrate 100 and the orthographic projection of the common signal line 400 on the substrate 100, such that a portion, overlapped with the pixel electrode 201, of the common electrode line 400 forms a storage capacitance Cst within this sub-pixel region 00a.

The common signal line 400 has a plurality of electrode structures 400a. Different electrode structures 400a are disposed within different sub-pixel regions 00a. The plurality of electrode structures 400a include lap electrodes 401 that are lapped to the common electrode layer 300, and auxiliary electrodes 402 that are not lapped to the common electrode layer 300.

Figure 7:
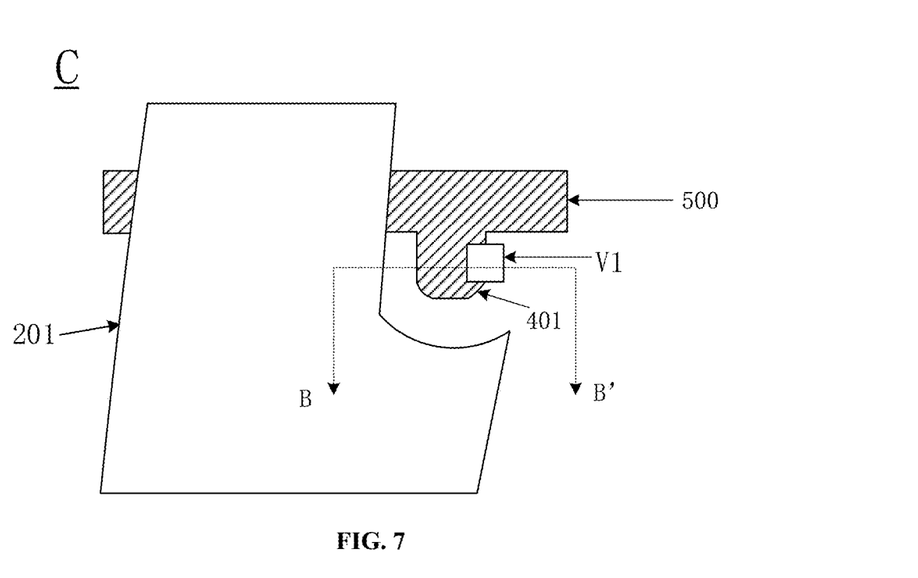
FIG. 7 is a partially enlarged view of the array substrate illustrated in FIG. 5 at a position C.

In some embodiments of the present disclosure, referring to FIG. 7, which is a partially enlarged view of the array substrate illustrated in FIG. 5 at a position C, an insulating layer is typically present between the conductive layer where the common signal line 400 is disposed and the common electrode layer 300. Therefore, it is necessary to form a via V1 within the array substrate 000, such that the common electrode layer 300 is electrically connected to the lap electrode 401 of the common signal line 400 by the via V1.

Figure 8:
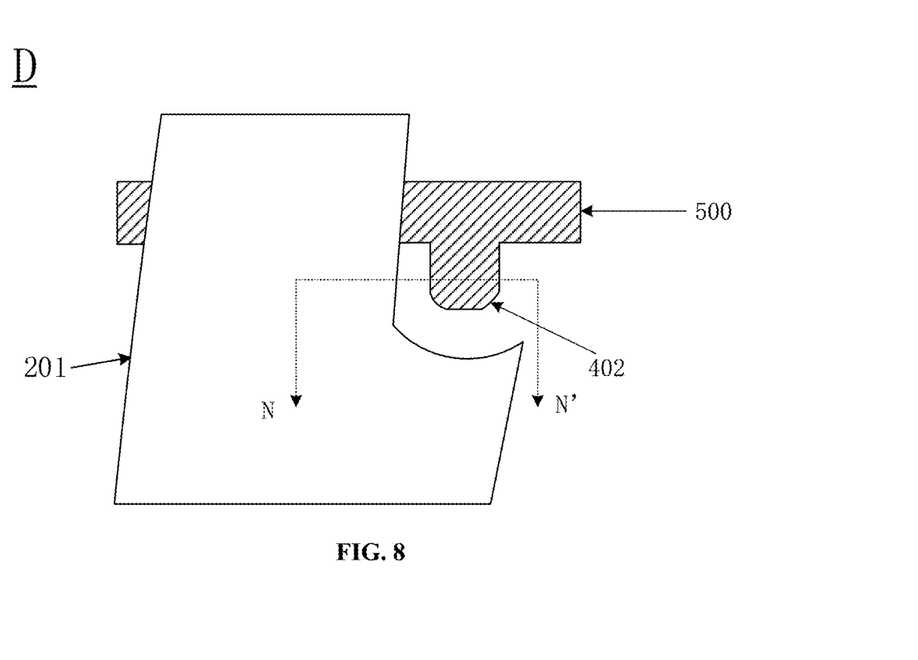
FIG. 8 is a partially enlarged view of the array substrate illustrated in FIG. 5 at a position D.

Referring to FIG. 8, which is a partially enlarged view of the array substrate illustrated in FIG. 5 at a position D, the auxiliary electrode 402, in addition to the lap electrode 401, is provided within the auxiliary electrode 402 in the common signal line 400, and this auxiliary electrode 402 is not lapped to the common electrode layer 300. Accordingly, there is no need to form the via, which is configured to allow the common electrode layer 300 to be lapped with the common signal line 400, within the sub-pixel region 00a in which the auxiliary electrode 402 is distributed. In this way, the number of vias V1 formed in the array substrate 000 for allowing the common electrode layer 300 to be lapped with the common signal line 400 is effectively reduced, such that during the subsequent process of forming the alignment film on the array substrate 000, the probability of uneven diffusion of the alignment fluid used to form the alignment film is lower, and thus after this array substrate 000 is subsequently integrated within the display device, the probability of uneven brightness of the display device is low.

Moreover, in the present disclosure, by simultaneously providing the lap electrode 401 lapped with the common electrode layer 300 and the auxiliary electrode 402 not lapped with the common electrode layer 300 in the common electrode line 400, the magnitude of the storage capacitance Cst in the sub-pixel region 00a where the lap electrode 401 is disposed is the same as the magnitude of the storage capacitance Cst in the sub-pixel region 00a where the auxiliary electrode 401 is disposed. In this way, the value of ΔVp corresponding to the pixel electrode 201 within the sub-pixel region 00a in which the lap electrode 401 is disposed is approximately the same as the value of ΔVp corresponding to the pixel electrode 201 within the sub-pixel region 00a in which the auxiliary electrode 401 is disposed. Therefore, in the case where the array substrate 000 in the present disclosure is integrated within the display device and the display device displays images in a column inversion manner, the images displayed by the display device have a lower probability of experiencing undesirable phenomena such as screen flickering and jittering, which effectively improves the display effect of the display device.

In summary, the array substrate according to some embodiments of the present disclosure includes the substrate, and the pixel electrode layer, the common electrode layer, and the plurality of common signal lines that are disposed on the substrate. The lap electrode lapped with the common electrode layer and the auxiliary electrode not lapped with the common electrode layer are both provided in the common electrode lines. In this way, the number of vias formed within the array substrate for allowing the common electrode layer to be lapped with the common signal lines is effectively reduced, such that during the subsequent process of forming the alignment film on the array substrate, the probability of uneven diffusion of the alignment fluid used to form the alignment film is lower, and thus the probability of uneven brightness of the display device is lower after this array substrate is integrated within the display device. Moreover, by providing both the lap electrode and the auxiliary electrode in the common electrode line, the magnitude of the storage capacitance in the sub-pixel region where the lap electrode is disposed is approximately the same as the magnitude of the storage capacitance in the sub-pixel region where the auxiliary electrode is disposed, such that it is ensured that the value of ΔVp corresponding to the pixel electrode in the sub-pixel region where the lap electrode is disposed is approximately the same as the value of ΔVp corresponding to the pixel electrode in the sub-pixel region where the auxiliary electrode is disposed. Therefore, in the case where the array substrate in the present disclosure is integrated within a display device and the display device displays images in a column inversion manner, the probability of undesirable phenomena such as screen flickering and jittering occurring in the images displayed by the display device is low, which effectively improves the display effect of the display device.

In the present disclosure, as shown in FIG. 5, the orthographic projections of the respective electrode structures 400a on the substrate 100 have the same shape and the same area. That is, the orthographic projection of the lap electrode 401 in the common signal line 400 on the substrate 100 and the orthographic projection of the lap electrode 401 on the substrate 100 have the same shape and the same area. In this case, the magnitude of the storage capacitance Cst in the sub-pixel region 00a where the lap electrode 401 is disposed is the same as the magnitude of the storage capacitance Cst in the sub-pixel region 00a where the auxiliary electrode 401 is disposed, such that the probability of undesirable phenomena such as screen flickering and jittering occurring in the images displayed by the display device is further lowered.

In the present disclosure, as shown in FIG. 5, the plurality of sub-pixel regions 00a within the array substrate 000 include sub-pixel regions 00a of at least two colors. The plurality of electrode structures 400a are in one-to-one correspondence with the plurality of sub-pixel regions 00a within the sub-pixel regions 00a of the same color, and each of the electrode structures 400a is disposed within the corresponding sub-pixel region 00a. Exemplarily, the plurality of sub-pixel regions 00a include sub-pixel regions 00a of three colors, which are: red sub-pixel regions R, green sub-pixel regions G, and blue sub-pixel regions (B1, B2).

The sub-pixel regions where the electrode structures 400a are distributed are the sub-pixel regions of the same color. For example, in FIG. 5, the sub-pixel regions distributed with the electrode structures 400a are blue sub-pixel regions (B1, B2). Because the electrode structure 400a of the common electrode line 400 is usually made of an opaque metallic material. Therefore, in the case where the electrode structure 400a is distributed within the sub-pixel region 00a, an aperture rate of this sub-pixel region 00a is reduced. To improve the eye protection of the display device, it is usually necessary to reduce the emission intensity of blue light when the display device displays images, and the blue light has less effect on the display effect of the display device. Therefore, when the electrode structures 400a are all distributed within the blue sub-pixel regions (B1, B2), even if the aperture rate of the blue sub-pixel regions (B1, B2) is small, the overall display effect of the display device is not affected, and at the same time, the intensity of blue light emitted by the display device when displaying the images is also ensured to be low, such that the eye protection of this display device is good.

Exemplarily, as shown in FIG. 5, in the sub-pixel regions 00a of the same color, for any adjacent two sub-pixel regions (B1, B2), the lap electrode 401 is distributed in one of the two sub-pixel regions B1, and the auxiliary electrode 402 is distributed in the other of the two sub-pixel regions B2. Exemplarily, in FIG. 5, the lap electrode 401 is distributed in each sub-pixel region B1, and the auxiliary electrode 402 is distributed in each sub-pixel region B2.

In this case, the lap electrodes 401 are uniformly distributed within the array substrate 000, the auxiliary electrodes 402 are also uniformly distributed within the array substrate 000, and the vias V1, corresponding to the lap electrodes 401, in the array substrate 000 are also uniformly distributed within the array substrate 000. In this way, the uniformity of the diffusion of the alignment fluid for forming the alignment film is further improved, such that the undesirable problem of uneven brightness caused by the uneven diffusion of the alignment fluid is avoided, and thus the display effect of the display device is improved.

In the present disclosure, the array substrate 000 has a plurality of vias V1. The common electrode layer 300 is lapped to the lap electrode 401 by at least one of the vias V1, and an orthographic projection of the via V1 on the substrate 100 is at least partially overlapped with the orthographic projection of the lap electrode 401 on the substrate 100.

In some embodiments, the orthographic projection of the via V1 on the substrate 100 is within the orthographic projection of the lap electrode 401 on the substrate 100.

Figure 9:
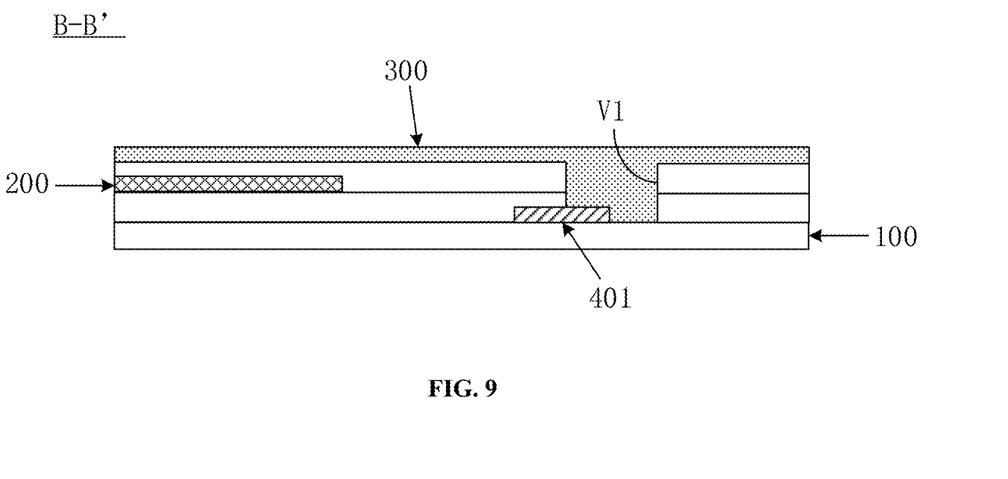
FIG. 9 is a cross-sectional view of the array substrate illustrated in FIG. 7 along a line B-B'.

In some embodiments, refer to FIG. 9, which is a cross-sectional view of the array substrate illustrated in FIG. 7 along a line B-B'. A portion of the orthographic projection of the via V1 on the substrate 100 is within the orthographic projection of the lap electrode 401 on the substrate 100, and another portion of the orthographic projection of the via V1 on the substrate 100 is outside the orthographic projection of the lap electrode 401 on the substrate 100. That is, the orthographic projection of the via V1 on the substrate 100 is only partially overlapped with the orthographic projection of the lap electrode 401 on the substrate 100.

In this case, a portion, overlapped with the lap electrode 401, of the via V1 has a smaller depth, and a portion, not overlapped with the lap electrode 401, of the via V1 has a larger depth. That is, the via V1 has a deep-shallow via structure with deeper depths in localized regions and shallower depths in localized regions. This deep-shallow via structure facilitates the diffusion of the alignment fluid, which further improves the uniformity of the diffusion of the alignment fluid used to form the alignment film, such that the undesirable problem of uneven brightness caused by the uneven diffusion of the alignment fluid is avoided, and thus the display effect of the display device is improved.

Figure 10:
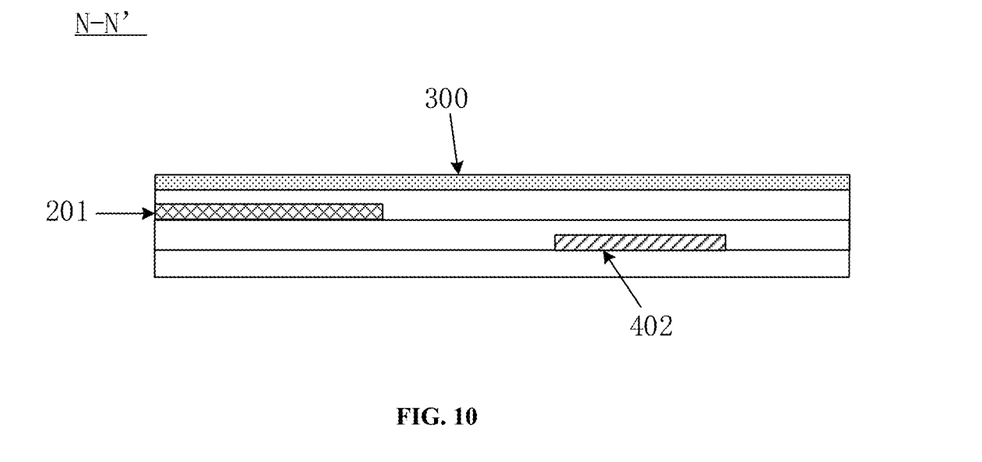
FIG. 10 is a cross-sectional view of the array substrate illustrated in FIG. 8 along a line N-N'.

FIG. 10 is a cross-sectional view of the array substrate illustrated in FIG. 8 along a line N-N'. Referring to FIG. 10, the auxiliary electrode 402 is not lapped with the common electrode layer 300, and there is no need to form the via V1 which is configured to allow the common electrode layer 300 to be lapped with the common signal line 400. In this way, the number of vias V1 formed within the array substrate 000 configured to allow the common electrode layer 300 to be lapped with the common signal line 400 is effectively reduced.

Referring to FIGS. 6 to 8, the pixel electrode layer 200 is closer to the substrate 100 with respect to the common electrode layer 300, and the pixel electrode layer 200 in the array substrate 000 includes a pixel electrode 201 disposed within the sub-pixel region 00a. An orthographic projection of the pixel electrode 201 on the substrate 100 is not coincident with the orthographic projection of the electrode structure 400a on the substrate 100.

In this case, in the case where the electrode structure 400a is the lap electrode 401, the lap electrode 401 needs to run through the pixel electrode layer 200 to be electrically connected to the common electrode 300, and in the case where the orthographic projection of the pixel electrode 201 on the substrate 100 is overlapped with the orthographic projection of the electrode structure 400a on the substrate 100, it is possible to prevent short circuit from occurring between the lap electrode 401 and the pixel electrode 201 when the lap electrode 401 is electrically connected to the common electrode 300.

It should be noted that in other embodiments, the common electrode layer 300 is closer to the substrate 100 with respect to the pixel electrode layer 200, in which case the common electrode layer 300 is electrically connected to the lap electrode 401 directly by the via V1 without having to run through the pixel electrode layer 200. In this way, the orthographic projection of the pixel electrode layer 200 on the substrate 100 is coincident with the orthographic projection of the electrode structure 400a on the substrate 100.

Figure 11:
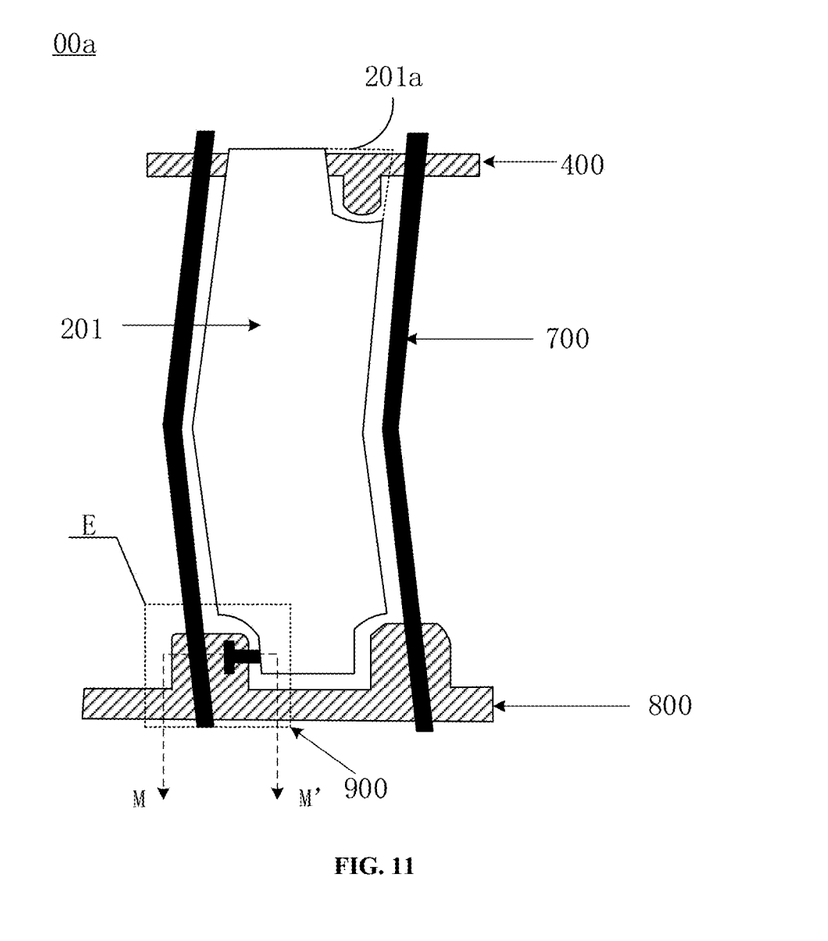
FIG. 11 is a schematic structural view of an array substrate within a sub-pixel region illustrated in FIG. 5.

For a clearer understanding of the structure of the pixel electrode within the sub-pixel region, refer to FIG. 11, which is a schematic structural view of an array substrate within a sub-pixel region illustrated in FIG. 5. The pixel electrode 201 in the sub-pixel region 00a has a hollowed-out structure 201a. Within the same sub-pixel region 00a, the orthographic projection of the electrode structure 400a on the substrate 100 is within an orthographic projection of the hollowed-out structure 201a on the substrate 100.

In this case, in the case where the electrode structure 400a is the lap electrode 401, the lap electrode 401 needs to run through the pixel electrode layer 200 to be electrically connected to the common electrode 300. In the case where the pixel electrode 201 in the pixel electrode layer 200 has the hollowed-out structure 201a, it is possible to prevent a short circuit from occurring between the lap electrode 401 and the pixel electrode 201 when the lap electrode 401 is electrically connected to the common electrode 300.

It should be noted that a coupling capacitance is formed between the electrode structure 400a and the pixel electrode 201 within each pixel region 00a, and a magnitude of the coupling capacitance is related to a distance between an outer boundary of the electrode structure 400a and an outer boundary of the pixel electrode 201.

In some embodiments of the present disclosure, as shown in FIG. 5, within different sub-pixel regions 00a, outer boundaries of the orthographic projections of the electrode structures 400a on the substrate 100 are spaced equally from outer boundaries of the orthographic projections of the hollowed-out structures 201a on the substrate 100. In this way, the coupling capacitances formed between the electrode structures 400a and the pixel electrodes 201 are similar. The magnitude of the storage capacitance is related to the magnitude of the coupling capacitance. In the case where the distances between the outer boundaries of the orthographic projections of the electrode structures 400a on the substrate 100 and the outer boundaries of the orthographic projections of the hollowed-out structures 201a on the substrate 100 are equal, areas of the overlapped regions between the pixel electrodes 201 and the common electrode lines 400 are the same. In this way, it is ensured that the storage capacitances between the electrode structures 400a and the pixel electrodes 201 are the same in the respective pixel regions 00a.

Referring to FIG. 11, the array substrate 000 further includes a plurality of transistors 900 disposed on the substrate 100. The plurality of transistors 900 are in one-to-one correspondence with the plurality of pixel electrodes 201. For a clearer understanding of the structure of the array substrate 000, refer to FIG. 12, which is a schematic view of film layers of the array substrate illustrated in FIG. 11 along a line M-M'. A gate line 800 is electrically connected to a gate electrode 904 of each transistor 900 in the same row of transistors 900. The gate line 800 and the common signal line 400 are disposed in the same layer and made of the same material. An extension direction of the gate line 800 is parallel to the extension direction of the common signal line 400. A data line 700 is electrically connected to a first electrode 901 of each transistor 900 in the same column of transistors 900, and a second electrode 902 of the transistor 900 is electrically connected to a corresponding pixel electrode 201.

Figure 13:
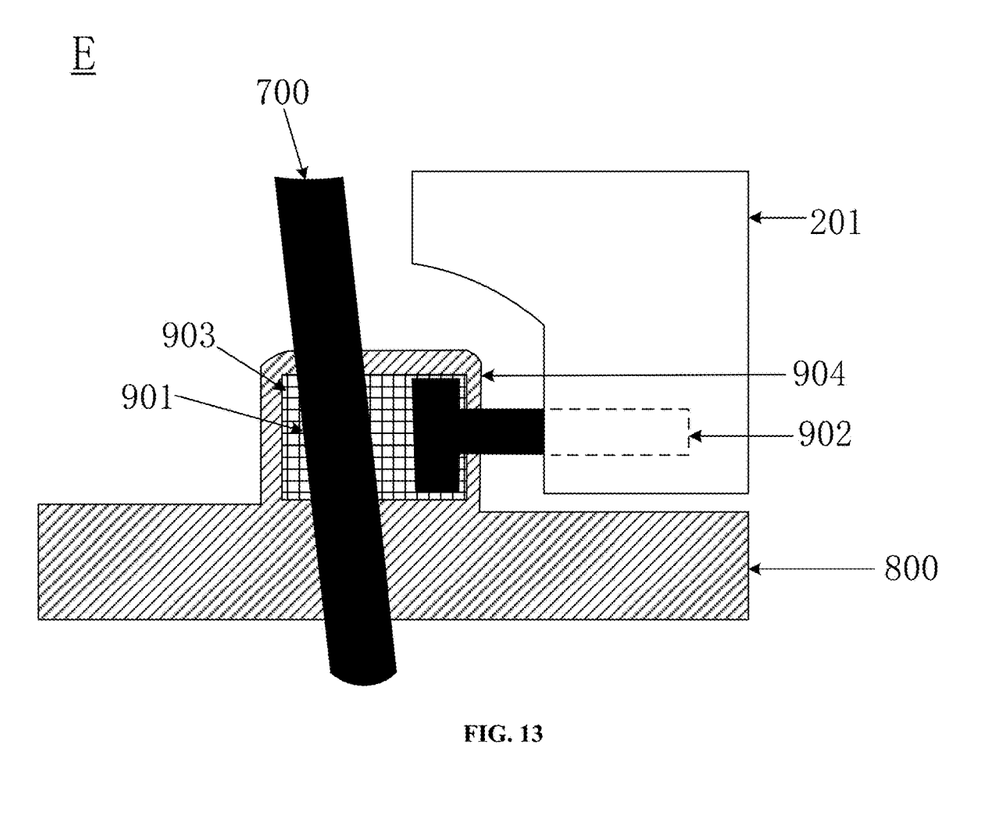
FIG. 13 is a partially enlarged view of the array substrate illustrated in FIG. 11 at a position E.

Optionally, reference is made to FIG. 13, which is a partially enlarged view of the array substrate illustrated in FIG. 11 at a position E. The first electrode 901 is a source electrode of the transistor 900, and the second electrode 902 is a drain electrode of the transistor 900. The transistor 900 includes a gate electrode 904, a source electrode 901, a drain electrode 902, and an active layer 903.

Figure 12:
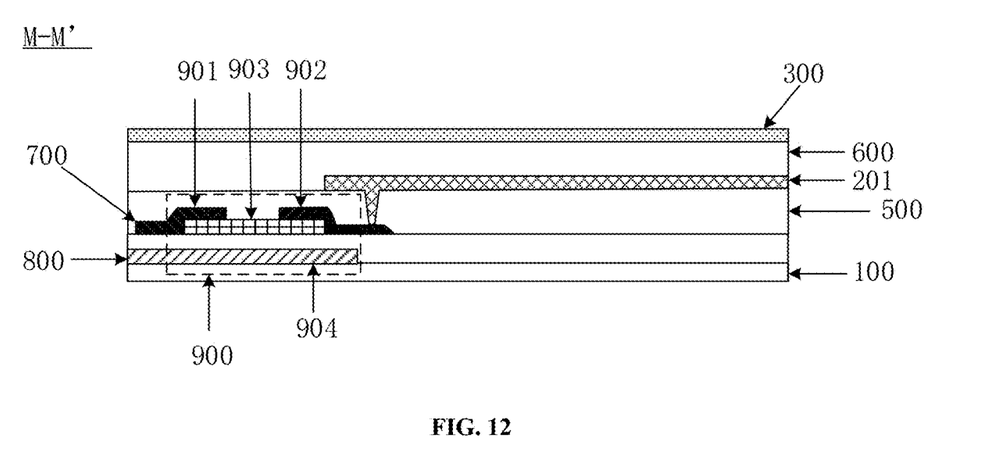
FIG. 12 is a schematic view of film layers of the array substrate illustrated in FIG. 11 along a line M-M'.

Referring to FIG. 12, the array substrate 000 further includes a first insulating layer 500 disposed on a side, away from the substrate 100, of the plurality of transistors 900, and a second insulating layer 600 disposed between the pixel electrode layer 200 and the common electrode layer 300. The pixel electrode layer 200 is disposed on a side, away from the substrate 100, of the first insulating layer 500, and the pixel electrode layer 200 is closer to the substrate 100 relative to the common electrode layer 300. By providing the second insulating layer 600 between the pixel electrode layer 200 and the common electrode layer 300, a liquid crystal capacitance is formed in an overlapped portion of the common electrode layer 300 and the pixel electrode layer 200.

Figure 14:
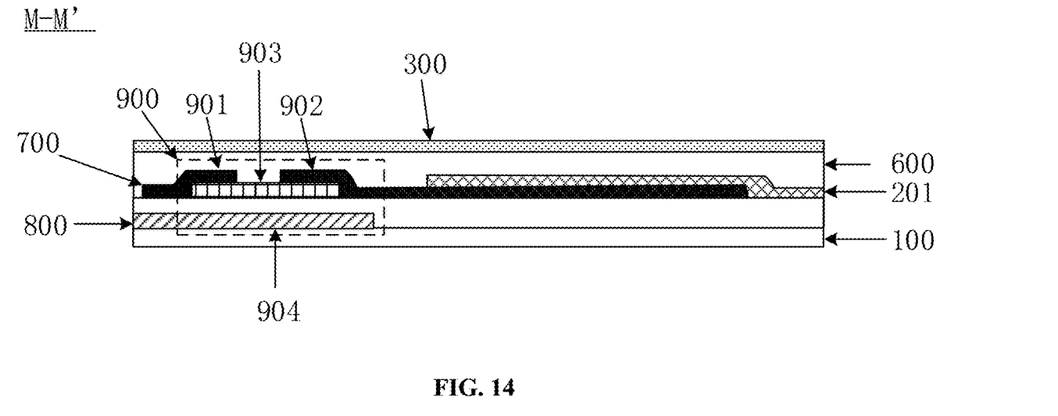
FIG. 14 is another schematic view of film layers of the array substrate illustrated in FIG. 11 along the line M-M'.

In some embodiments, reference is made to FIG. 14, which is another schematic view of film layers of the array substrate illustrated in FIG. 11 along the line M-M'. The first insulating layer 500 is not provided between the transistors 900 and the pixel electrode 201, and the second electrode 902 of the transistor 900 is directly lapped with the corresponding pixel electrode 201. In this way, the process steps are saved and the production cost is reduced.

It should be noted that for any adjacent two transistors 900 in a column of transistors 900 electrically connected to the same data line 700, one transistor 900 is disposed on one side of the data line 700 and the other transistor 900 is disposed on the other side of the data line 700. The pixel voltages loaded by the pixel electrodes 201 within the respective sub-pixel regions 00a before and after the column inversion have opposite polarities, and the pixel voltages loaded by the pixel electrodes 201 within any adjacent two sub-pixel regions 00a have opposite polarities before and after the column inversion.

Figure 15:
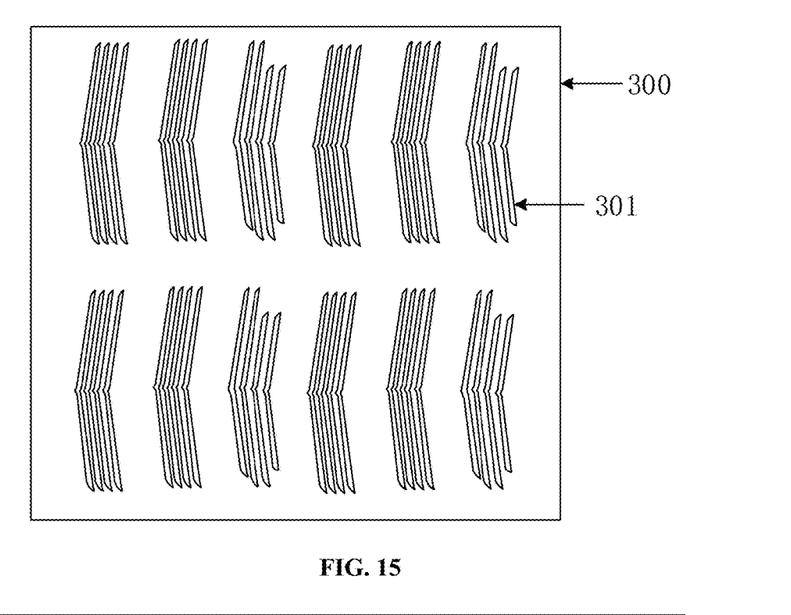
FIG. 15 is a schematic structural view of a common electrode layer of the array substrate illustrated in FIG. 5.

FIG. 15 is a schematic structural view of a common electrode layer of the array substrate illustrated in FIG. 5. Referring to FIG. 15, the common electrode layer 300 in the array substrate 000 has a plurality of slits 301. In this way, an electric field in a direction parallel to the substrate 100 is formed between the pixel electrodes 201 in the respective pixel regions 00a and the common electrode layer 300 having the plurality of slits 301, and the liquid crystal is driven by the electric field to deflect along the direction parallel to the substrate 100.

In summary, the array substrate according to some embodiments of the present disclosure includes the substrate, and the pixel electrode layer, the common electrode layer, and the plurality of common signal lines that are disposed on the substrate. The lap electrode lapped with the common electrode layer and the auxiliary electrode not lapped with the common electrode layer are both provided in the common electrode lines. In this way, the number of vias formed within the array substrate for allowing the common electrode layer to be lapped with the common signal lines is effectively reduced, such that during the subsequent process of forming the alignment film on the array substrate, the probability of uneven diffusion of the alignment fluid used to form the alignment film is lower, and thus the probability of uneven brightness of the display device is lower after this array substrate is integrated within the display device. Moreover, by providing both the lap electrode and the auxiliary electrode in the common electrode line, the magnitude of the storage capacitance in the sub-pixel region where the lap electrode is disposed is approximately the same as the magnitude of the storage capacitance in the sub-pixel region where the auxiliary electrode is disposed, such that it is ensured that the value of $\Delta Vp$ corresponding to the pixel electrode in the sub-pixel region where the lap electrode is disposed is approximately the same as the value of $\Delta Vp$ corresponding to the pixel electrode in the sub-pixel region where the auxiliary electrode is disposed. Therefore, in the case where the array substrate in the present disclosure is integrated within a display device and the display device displays images in a column inversion manner, the probability of undesirable phenomena such as screen flickering and jittering occurring in the images displayed by the display device is low, which effectively improves the display effect of the display device.

Figure 16:
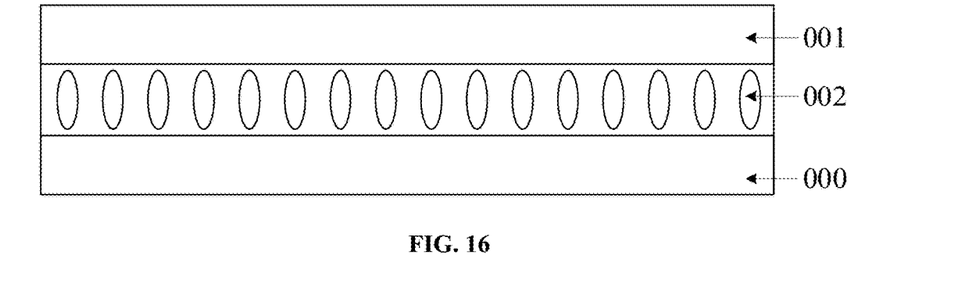
FIG. 16 is a schematic structural diagram of film layers of a display device according to some embodiments of the present disclosure.

Some embodiments of the present disclosure further provide a display device. FIG. 16 is a schematic structural diagram of film layers of a display device according to some embodiments of the present disclosure. As shown in FIG. 16, the display device includes a color film substrate 001, a liquid crystal layer 002, and the array substrates 000 as described above. The array substrate 000 and the color film substrate 001 are disposed opposite to each other, and the liquid crystal layer 002 is disposed between the array substrate 000 and the color film substrate 001. In some embodiments of the present disclosure, the display device is a liquid crystal panel, electronic paper, a mobile phone, a tablet computer, a television, a monitor, a laptop computer, a digital photo frame, a navigator, and any other product or component having a display function.

It should be noted that in the accompanying drawings, the sizes of layers and regions may be exaggerated for clearer illustration. It should be understood that where an element or layer is referred to as being "on" another element or layer, the element or layer may be directly on another element, or intervening layers therebetween may be present. In addition, it should be understood that where an element or layer is referred to as being "under" another element or layer, the element or layer may be directly under the other element, or there may be more than one intervening layer or element. In addition, it may be further understood that in the case that a layer or element is referred to as being "between" two layers or two elements, the layer may be the only layer between the two layers or two elements, or more than one intervening layer or element may further be present. Like reference numerals indicate like elements throughout.

In the present disclosure, the terms "first" and "second" are only used for descriptive purposes, and cannot be understood as indicating or implying relative importance. The term "a plurality of" refers to two or more, unless expressly defined otherwise.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

The invention claimed is:

1. An array substrate, having a plurality of sub-pixel regions, the array substrate comprising:
    a substrate;
    a pixel electrode layer and a common electrode layer that are disposed on the substrate; and
    a plurality of common signal lines disposed on the substrate, wherein the plurality of common signal lines are insulated from the pixel electrode layer and electrically connected to the common electrode layer, and an overlapped region is present between an orthographic projection of the common signal lines on the substrate and an orthographic projection of the pixel electrode layer on the substrate;
    wherein the common signal lines have a plurality of electrode structures, wherein different electrode structures of the plurality of electrodes structures are disposed in different sub-pixel regions, and the plurality of electrode structures comprise a lap electrode lapped to the common electrode layer and an auxiliary electrode not lapped to the common electrode layer.

2. The array substrate according to claim 1, wherein an orthographic projection of the auxiliary electrode on the substrate and an orthographic projection of the lap electrode on the substrate have a same shape and a same area.

3. The array substrate according to claim 1, wherein the plurality of sub-pixel regions comprise sub-pixel regions of at least two colors, wherein the plurality of electrode structures are in one-to-one correspondence with a plurality of the sub-pixel regions within sub-pixel regions of a same color, and each of the electrode structures is disposed in a corresponding one of the sub-pixel regions.

4. The array substrate according to claim 3, wherein for any adjacent two sub-pixel regions of the sub-pixel regions of the same color, one of the two pixel regions has the lap electrode distributed therein, and the other of the two pixel regions has the auxiliary electrode distributed therein.

5. The array substrate according to claim 3, wherein the sub-pixel region in which the electrode structure is distributed is a blue sub-pixel region.

6. The array substrate according to claim 1, having a plurality of vias, wherein the common electrode layer is lapped to the lap electrode by at least one of the vias, and an orthographic projection of each of the vias on the substrate is at least partially overlapped with an orthographic projection of the lap electrode on the substrate.

7. The array substrate according to claim 6, wherein one portion of the orthographic projection of the via on the substrate is within the orthographic projection of the lap electrode on the substrate, and the other portion of the orthographic projection of the via on the substrate is outside the orthographic projection of the lap electrode on the substrate.

8. The array substrate according to claim 1, wherein
    the pixel electrode layer is closer to the substrate with respect to the common electrode layer, and
    the pixel electrode layer comprises a pixel electrode disposed within the sub-pixel region, wherein an orthographic projection of the pixel electrode on the substrate is not overlapped with an orthographic projection of the electrode structure on the substrate.

9. The array substrate according to claim 8, wherein a hollowed-out structure is formed in the pixel electrode, wherein within a same one of the sub-pixel regions, the orthographic projection of the electrode structure on the substrate is within an orthographic projection of the hollowed-out structure on the substrate.

10. The array substrate according to claim 9, wherein within the respective sub-pixel regions, outer boundaries of the orthographic projections of the electrode structures on the substrate are spaced equally from outer boundaries of the orthographic projections of the hollowed-out structures on the substrate.

11. The array substrate according to claim 9, wherein the common electrode layer has a plurality of slits.

12. The array substrate according to claim 8, further comprising: a plurality of data lines, a plurality of gate lines, and a plurality of transistors, the plurality of transistors being in one-to-one correspondence with a plurality of the pixel electrodes; wherein
    one of the gate lines is electrically connected to a gate electrode of each of the transistors in a same row of the transistors, wherein the gate line and the common signal lines are disposed in a same layer and made of a same material, and an extension direction of the gate line is parallel to an extension direction of each of the common signal lines; and
    one of the data lines is electrically connected to a first electrode of each of the transistors in a same column of the transistors, and a second electrode of each of the transistors is electrically connected to a corresponding one of the pixel electrodes.

13. The array substrate according to claim 12, wherein for any adjacent two transistors in a column of the transistors that are electrically connected to a same one of the data lines, one of the two transistors is disposed on one side of the data line, and the other of the two transistors is disposed on the other side of the data line.

14. The array substrate according to claim 12, further comprising: a first insulating layer disposed on a side, away from the substrate, of the plurality of transistors, and a second insulating layer disposed between the pixel electrode layer and the common electrode layer;
    wherein the pixel electrode layer is disposed on a side, away from the substrate, of the first insulating layer.

15. A display device, comprising: a color film substrate, a liquid crystal layer, and an array substrate;
    wherein the array substrate and the color film substrate are disposed opposite to each other, and the liquid crystal layer is disposed between the array substrate and the color film substrate; and
    the array substrate has a plurality of sub-pixel regions, and the array substrate comprises:
        a substrate;

a pixel electrode layer and a common electrode layer that are disposed on the substrate; and a plurality of common signal lines disposed on the substrate, wherein the plurality of common signal lines are insulated from the pixel electrode layer and electrically connected to the common electrode layer, and an overlapped region is present between an orthographic projection of the common signal lines on the substrate and an orthographic projection of the pixel electrode layer on the substrate;

wherein the common signal lines have a plurality of electrode structures, wherein different electrode structures of the plurality of electrodes structures are disposed in different sub-pixel regions, and the plurality of electrode structures comprise a lap electrode lapped to the common electrode layer and an auxiliary electrode not lapped to the common electrode layer.

16. The display device according to claim 15, wherein an orthographic projection of the auxiliary electrode on the substrate and an orthographic projection of the lap electrode on the substrate have a same shape and a same area.

17. The display device according to claim 15, wherein the plurality of sub-pixel regions comprise sub-pixel regions of at least two colors, wherein the plurality of electrode structures are in one-to-one correspondence with a plurality of the sub-pixel regions within sub-pixel regions of a same color, and each of the electrode structures is disposed in a corresponding one of the sub-pixel regions.

18. The display device according to claim 17, wherein for any adjacent two sub-pixel regions of the sub-pixel regions of the same color, one of the two pixel regions has the lap electrode distributed therein, and the other of the two pixel regions has the auxiliary electrode distributed therein.

19. The display device according to claim 17, wherein the sub-pixel region in which the electrode structure is distributed is a blue sub-pixel region.

20. The display device according to claim 15, wherein the array substrate has a plurality of vias, wherein the common electrode layer is lapped to the lap electrode by at least one of the vias, and an orthographic projection of each of the vias on the substrate is at least partially overlapped with an orthographic projection of the lap electrode on the substrate.

* * * * *